(12) United States Patent
Jang

(10) Patent No.: US 6,268,272 B1
(45) Date of Patent: Jul. 31, 2001

(54) METHOD OF FORMING GATE ELECTRODE WITH TITANIUM POLYCIDE

(75) Inventor: Se Aug Jang, Kyoungki-do (KR)

(73) Assignee: Hyundai Electronics Industries Co., Ltd., Ich'on (KR)

(*) Notice: Subject to any disclaimer, the term of this patent is extended or adjusted under 35 U.S.C. 154(b) by 0 days.

(21) Appl. No.: 09/456,810

(22) Filed: Dec. 8, 1999

(30) Foreign Application Priority Data

Dec. 22, 1998 (KR) .................................................. 98-57325

(51) Int. Cl.[7] ..................... H01L 21/3205; H01L 21/425; H01L 21/44
(52) U.S. Cl. ......................... 438/592; 438/525; 438/532; 438/655; 438/656; 438/657; 438/683
(58) Field of Search ..................... 438/592, 302, 438/369, 486, 491, 514, 517, 525, 532, 655, 656, 657, 664, 682, 683, 685

(56) References Cited

U.S. PATENT DOCUMENTS

| | | | |
|---|---|---|---|
| 4,443,930 | 4/1984 | Hwang et al. | 29/571 |
| 4,450,620 | 5/1984 | Fuls et al. | 29/571 |
| 5,510,295 * | 4/1996 | Cabral, Jr. et al. | 437/200 |
| 5,541,131 | 7/1996 | Yoo et al. | |
| 5,607,884 | 3/1997 | Byun | |
| 5,731,239 | 3/1998 | Wong et al. | 438/296 |
| 5,759,899 | 6/1998 | Saito | 438/303 |
| 5,869,397 | 2/1999 | Miyakawa | 438/655 |
| 5,924,001 * | 7/1999 | Yang et al. | 438/592 |

FOREIGN PATENT DOCUMENTS

| | | | |
|---|---|---|---|
| 01059812 | 3/1989 | (JP) | H01L/21/28 |
| 01106468 | 4/1989 | (JP) | H01L/29/78 |
| 02035773 | 2/1990 | (JP) | H01L/29/46 |
| 03022539 | 1/1991 | (JP) | H01L/21/336 |
| 04032225 | 2/1992 | (JP) | H01L/21/28 |
| 05067632 | 3/1993 | (JP) | H01L/21/336 |
| 06037267 | 2/1994 | (JP) | H01L/27/092 |
| 06045352 | 2/1994 | (JP) | H01L/21/336 |
| 06112158 | 4/1994 | (JP) | H01L/21/28 |
| 06196687 | 7/1994 | (JP) | H01L/29/784 |
| 06216324 | 8/1994 | (JP) | H01L/27/092 |
| 07161976 | 6/1995 | (JP) | H01L/29/78 |
| 10223560 | 8/1998 | (JP) | H01L/21/28 |
| 10303422 | 11/1998 | (JP) | H01L/29/78 |

* cited by examiner

Primary Examiner—Matthew Smith
Assistant Examiner—Lex H. Malsawma
(74) Attorney, Agent, or Firm—Finnegan, Henderson, Farabow, Garrett & Dunner, L.L.P.

(57) ABSTRACT

A method of forming a gate electrode with a titanium polycide which can prevent particle creation and abnormal oxidation of the gate electrode, is disclosed.

In the present invention, a gate oxidation process is performed after implanting Si ions into the side wall or overall surface of the titanium silicide layer, thereby preventing abnormal oxidation of the titanium silicide during the gate oxidation process. Furthermore, a titanium silicide layer is deposited to a low mole ratio of Si/Ti, thereby minimizing particle creation.

15 Claims, 6 Drawing Sheets

METHOD OF FORMING GATE ELECTRODE WITH TITANIUM POLYCIDE

BACKGROUND OF THE INVENTION

1. Field of the Invention

The present invention relates to a method of manufacturing semiconductor device, particularly to a method of forming a gate electrode for a MOSFET, and more particularly to a method of forming a gate electrode with a titanium polycide in which a titanium silicide layer is formed on a polysilicon layer.

2. Description of the Related Art

In general, a gate electrode of a MOS transistor has been formed of a doped polysilicon layer. However, as high integration of semiconductor device, the line widths of a gate electrode and other patterns become fine. Recently, the line width is reduced below 0.15 μm. Therefore, there are problems that it is difficult to apply the doped polysilicon layer to a gate electrode material in a high speed device, since the doped polysilicon layer has a high resistivity. These problems are also growing more and more serious as the high integration of the semiconductor. To overcome these problems, a gate electrode with a titanium polycide structure in which a titanium silicide layer is formed on the polysilicon layer, is applied to a semiconductor device over 1 GDRAM.

Here, the titanium silicide layer is formed by two methods as follows.

A first method deposits a titanium(Ti) layer on a polysilicon layer and performs annealing, to react the Ti with Si of the polysilicon layer, thereby forming a titanium silicide (TiSi$_2$) layer. A second method deposits a TiSix layer of an amorphous phase on a polysilicon layer by physical vapor deposition(PVD) using a sputtering target of TiSix(x= 1.8~2.5) and performs annealing, thereby forming a TiSi$_2$ layer of a crystalline phase.

FIG. 1A to FIG. 1E are cross sectional views showing a process of forming a gate electrode with a titanium polycide according to a prior art, using the second method.

As shown in FIG. 1A, a gate oxide layer 11 is formed on a semiconductor substrate 10 and a doped polysilicon layer 12 is deposited thereon.

As shown in FIG. 1B, a TiSix layer 13 of an amorphous phase is deposited on the polysilicon layer 12 by physical vapor deposition(PVD) using TiSix target. Sequentially, rapid thermal process(RTP) is performed at a selected temperature for several seconds, to transform the TiSix layer 13 of the amorphous phase into a TiSi$_2$ layer 13a of a crystalline phase, as shown in FIG. 1C. A mask nitride(or oxide) layer 14 is then deposited on the TiSi$_2$ layer 13a, for a self-aligned contact(SAC) process which will be performed after.

As shown in FIG. 6D, the mask nitride layer 14, the TiSi2 layer 13a, the polysilicon layer 12 and the gate oxide layer 11 are patterned by etching process, to form a gate electrode.

Thereafter, for removing damage due to the etching process and polysilicon residues and improving the reliability of the gate insulating layer by forming bird's beak thereon, a gate re-oxidation process is performed by a well-known method, to form an oxide layer 15 on the side wall of the gate electrode and on the surface of the substrate 10.

However, when performing the gate re-oxidation process, the side wall of the TiSi$_2$ layer 13a is excessively oxidized, to occur in abnormal oxidation of the TiSi$_2$ layer 13a, as shown in FIG. 1E, thereby increasing resistivity of the gate electrode. The abnormal oxidation of the TiSi$_2$ layer 13a is influenced by mole ration x of Si to Ti(Si/Ti) in the TiSix sputtering target for depositing TiSix layer. For example, in the case of lowering the mole ratio x of Si/Ti below about 2.1, the abnormal oxidation is extremely occurred, in case raising the mole ratio x of Si/Ti above about 2.4, the abnormal oxidation is almost never occurred. Namely, in case that Si content of TiSix sputtering target is excessive, stoichiometrically, the oxidation ratio of the TiSi$_2$ layer 13a is equal to that of the polysilicon layer 12.

While it is of benefit to the gate re-oxidation process to raise the mole ratio x of Si/Ti in TiSix sputtering target, there is problem that particle increases with increasing x. Therefore, it is limited to utilize TiSix sputtering target having Si content above 2.4.

In general, TiSix sputtering target has mole ratio x of Si/Ti of 1.8 to 2.5. In FIG. 2, a dot line A shows that in case raising mole ratio x of Si/Ti in TiSix sputtering target, Si is excessive, thereby forming increasing particles. Furthermore, a dot line B shows that in the case of lowering the mole ration x of Si/Ti in SiTix sputtering target, Si is deplete to create pore in the target, thereby creating particles. A solid line C shows total particle distribution which occurs considering both cases described above. As a result, when utilizing TiSix sputtering target of the mole ratio x of Si/Ti of about 2.05 to 2.10, particle creation is minimized.

Accordingly, it is impossible to overcome problems such as particle creation and abnormal oxidation when forming gate electrode, using a prior art as above described.

SUMMARY OF THE INVENTION

It is therefore one object of the present invention to a method of forming a gate electrode with a titanium polycide which can prevent abnormal oxidation of a titanium silicide layer, by performing a gate re-oxidation process when the titanium silicide layer includes excessive Si ions, by implanting Si ions into side wall or overall surface of the titanium silicide layer after depositing the titanium silicide layer and prior to performing the gate re-oxidation process.

Furthermore, it is the other object of the present invention to a method of forming a gate electrode with a titanium polycide which can minimize particle creation, by decreasing mole ratio of Ti to Si in a titanium silicide layer.

To accomplish these above objects, a method of forming a gate electrode with a titanium polycide according to the present invention, includes the steps of: forming a gate insulating layer and a polysilicon layer on a semiconductor substrate, in sequence; forming a titanium silicide layer of an amorphous phase on the polysilicon layer; ion-implanting Si ions into the titanium silicide layer of the amorphous phase; transforming the titanium silicide layer of the amorphous phase into a titanium silicide layer of a crystalline phase by performing a thermal process; etching selectively the titanium silicide layer of the crystalline phase and the polysilicon layer in sequence to form a gate electrode; and performing a gate re-oxidation process.

Furthermore, a method of forming a gate electrode with a titanium polycide according to the present invention, includes the steps of: forming a gate insulating layer and a polysilicon layer on a semiconductor substrate, in sequence; forming a titanium silicide layer of an amorphous phase on the polysilicon layer; transforming the titanium silicide layer of the amorphous phase into a titanium silicide layer of a crystalline phase by performing a thermal process; ion-implanting Si ions into the titanium silicide layer of the crystalline phase; etching selectively the titanium silicide layer of the crystalline phase and the polysilicon layer in sequence to form a gate electrode; and performing a gate re-oxidation process.

Moreover, a method of forming a gate electrode with a titanium polycide according to the present invention, includes the steps of: forming a gate insulating layer and a polysilicon layer on semiconductor substrate, in sequence; forming a titanium silicide layer on the polysilicon layer; etching selectively the titanium silicide layer and the polysilicon layer in sequence to form a gate electrode; implanting Si into the side wall of the gate electrode using a tilt ion-implantation; and performing a gate re-oxidation process.

Additional object, advantages and novel features of the invention will be set forth in part in the description which follows, and in part will become apparent to those skilled in the art upon examination of the following or may be learned by practice of the invention. The objects and advantages of the invention may be realized and attained by means of the instrumentalities and combinations particularly pointed out in the appended claims.

DETAILED DESCRIPTION OF THE INVENTION

Hereinafter, preferred embodiments of the present invention will be explained with reference to accompanying drawings.

Firstly, FIG. 3A to FIG. 3F are cross sectional views showing a process of forming a gate electrode of a titanium polycide according to a first embodiment of the present invention. The first embodiment of the present invention will be explained, referring to FIG. 3A to FIG. 3F.

Figure 1A:
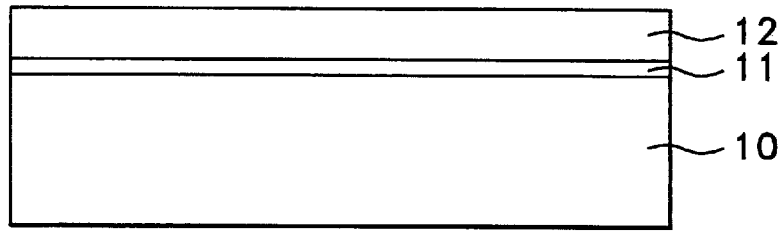
FIG. 1A to FIG. 1E are cross sectional views showing a process of forming a gate electrode of a titanium polycide structure according to a prior art.
Figure 1B:
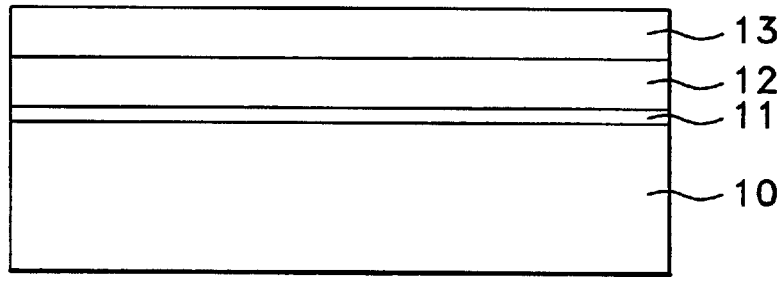
Figure 1C:
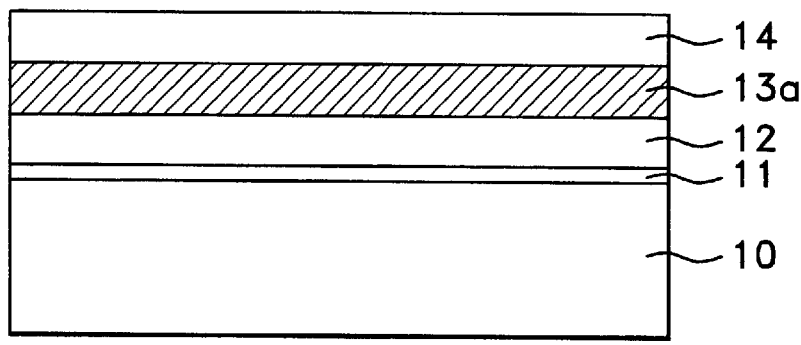
Figure 1D:
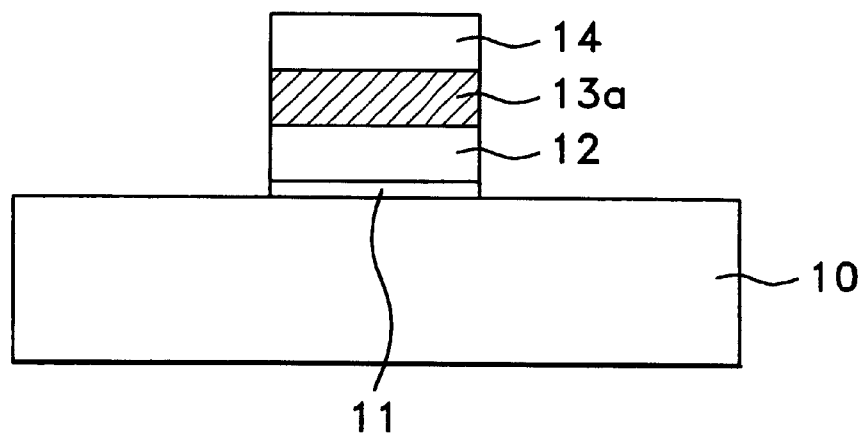
Figure 1E:
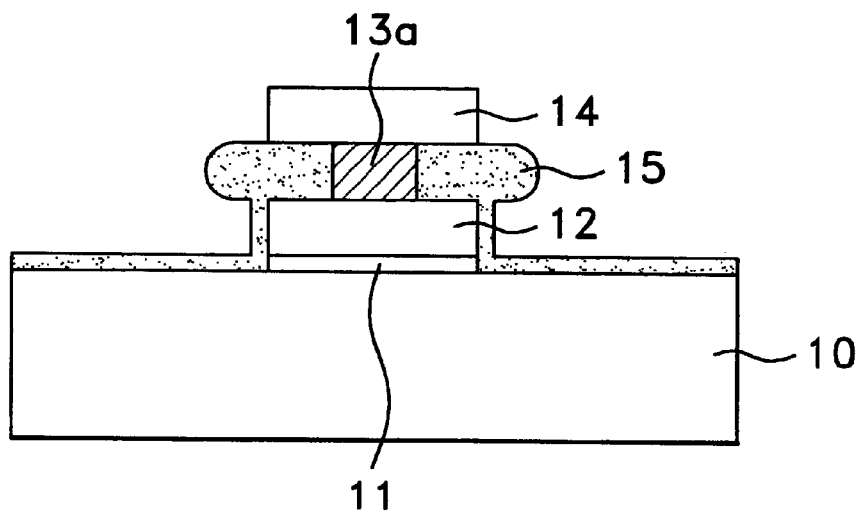
Figure 2:
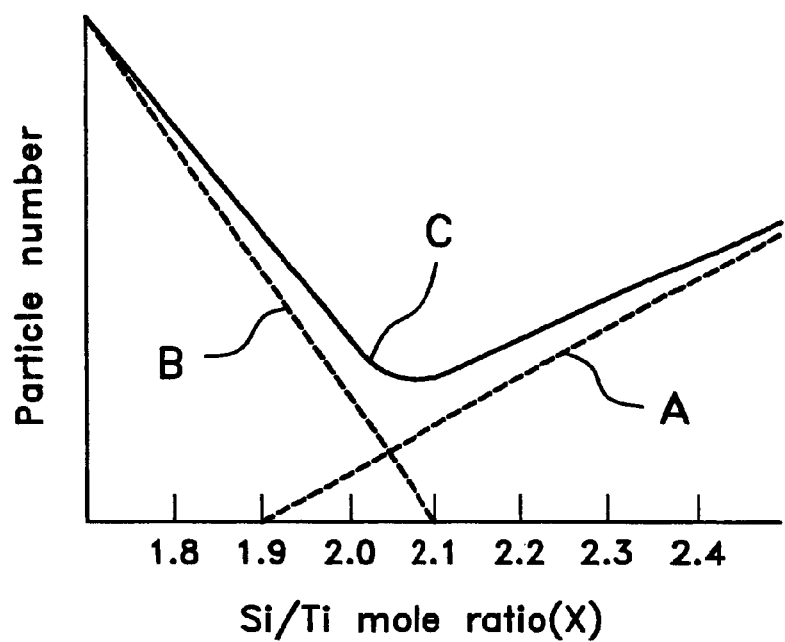
FIG. 2 is a graph showing particle occurrence frequency in accordance with mole ratio(x) of Si to Ti of sputtering target, TiSix when depositing a TiSix layer.
Figure 3A:
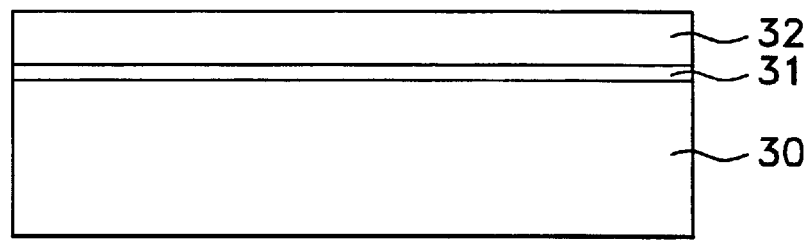
FIG. 3A to FIG. 3F are cross sectional views showing a process of forming a gate electrode of a titanium polycide according to a first embodiment of the present invention.

As shown in FIG. 3A, a gate oxide layer 31 is grown on a silicon substrate 30 and a doped polysilicon layer 32 is deposited thereon by low pressure CVD(LPCVD).

Figure 3B:
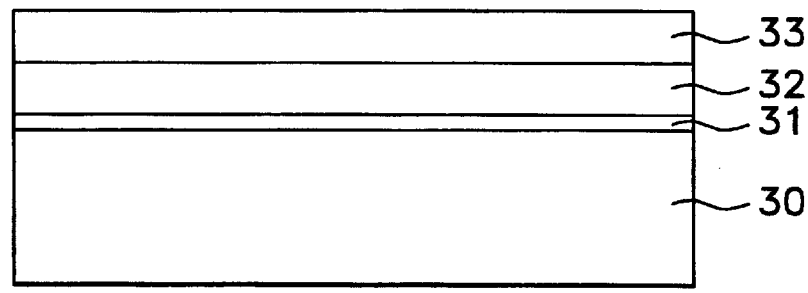

As shown in FIG. 3B, a TiSix layer 33 of an amorphous phase is deposited on the polysilicon layer 32 by PVD using a TiSix target. Preferably, the TiSix layer 33 is deposited to the thickness of 500 to 1000 Å. At this time, by utilizing TiSix target in which mole ratio x of Si/Ti is 2.0 to 2.2, particle creation is minimized.

Figure 3C:
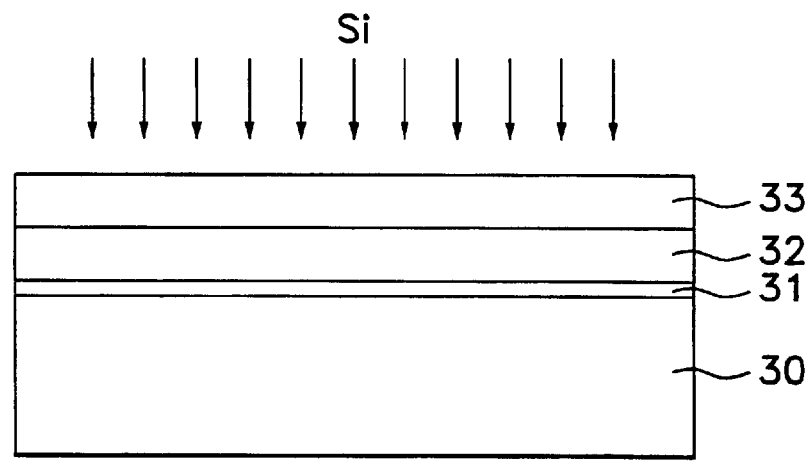

As shown in FIG. 3C, Si ions are implanted into the TiSix layer 33 by ion-implantation. Preferably, the ion-implantation is performed using the Si dose of $1 \times 10^{15}$ to $5 \times 10^{16}$ ions/cm$^2$, thereby increasing mole ratio x of Si/Ti in the TiSix layer 33.

Figure 3D:
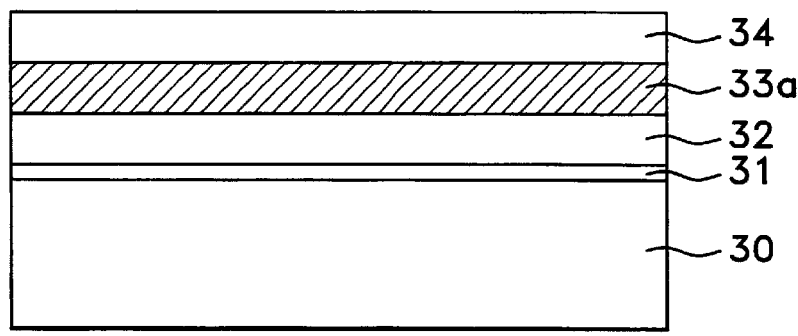

As shown in FIG. 3D, RTP is performed at the temperature of 700 to 950° C. for 10 to 30 seconds, so that the TiSix layer 33 of the amorphous phase is transformed into a TiSi$_2$ layer 33a of a crystalline phase. A mask oxide(or nitride) layer 34 is deposited on the overall substrate for a self-aligned contact (SAC) process which will be performed after.

Figure 3E:
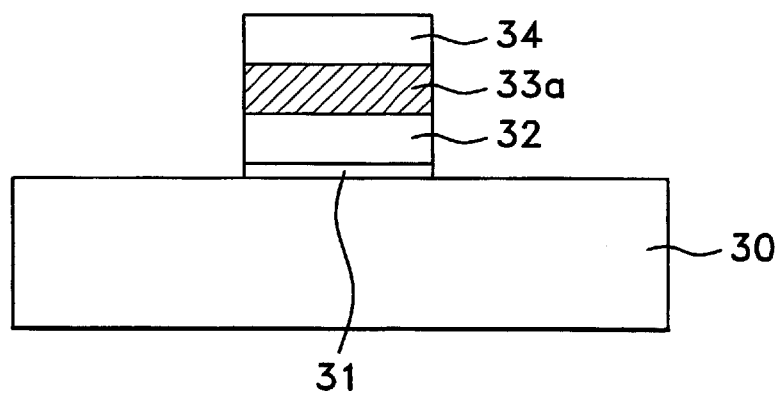

As shown in FIG. 3E, the mask oxide layer 34, the TiSi$_2$ layer 33a, the polysilicon layer 32 and the gate oxide layer 31 are selectively etched in sequence, to form a gate.

Figure 3F:
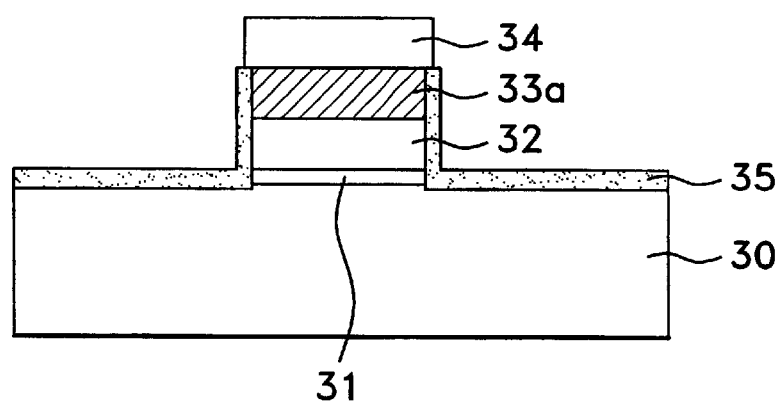

As shown in FIG. 3F, a gate re-oxidation process is carried out, so that an oxide layer 35 is formed on the side wall of the gate and the surface of the substrate. At this time, the TiSi$_2$ layer 33a is not oxidized abnormally, since excessive Si exists in the TiSi$_2$ layer by implantation of Si. In more detail, when oxidizing the TiSi$_2$ layer 33a, since excessive Si is oxidized instead of Ti, oxidation ratio of the TiSi$_2$ layer 33a is equalized to that of the polysilicon layer 32. Preferably, the gate re-oxidation process is performed at the temperature of 700 to 850° C. by dry oxidation method. Furthermore, the oxide layer 35 is formed to the thickness of 20 to 50 Å.

On the other hand, the ion-implantation of Si may be carried out after performing RTP for transforming phase of the TiSix layer 33 or after forming the mask oxide layer 34, instead of performing the ion-implantation of Si after depositing the TiSix layer 33 as above described.

Figure 4A:
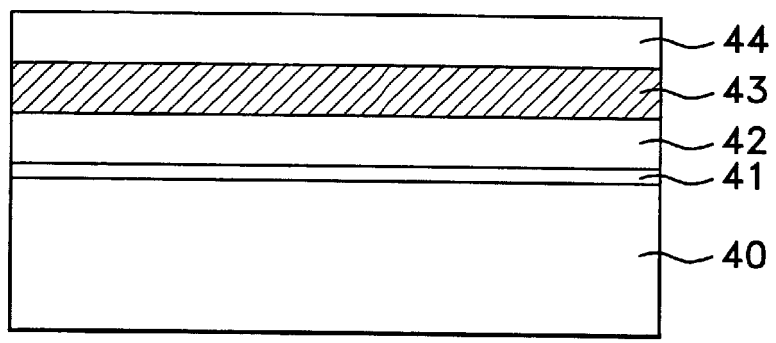
FIG. 4A to FIG. 4C are cross sectional views showing a process of forming a gate electrode of a titanium polycide according to a second embodiment of the present invention.
Figure 4B:
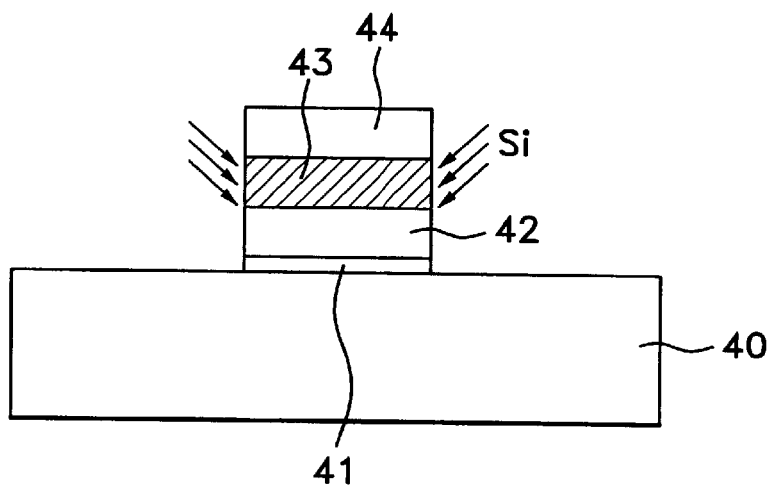
Figure 4C:
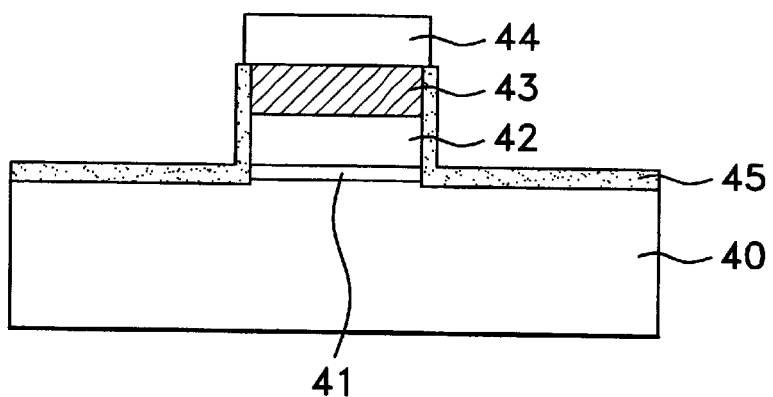

Secondly, FIG. 4A to FIG. 4C are cross sectional views showing a process of forming a gate electrode of a titanium polycide according to a second embodiment of the present invention. The second embodiment of the present invention will be explained, referring to FIG. 4A to FIG. 4C.

FIG. 4A shows a state that a gate oxide layer 41, a polysilicon layer 42, a TiSi$_2$ layer 43 and a mask oxide layer 44 are formed on a silicon substrate 40, by performing the processes illustrated in FIG. 3A to FIG. 3D except for ion-implantation of Si described in FIG. 3C of the first embodiment.

As shown in FIG. 4B, the mask oxide layer 44, the TiSi$_2$ layer 43, the polysilicon layer 42 and the gate oxide layer 41 are selectively etched in sequence, to form a gate electrode. Si ions are implanted into the side wall of the gate electrode by a tilt ion-implantation. Preferably, the tilted ion-implantation is performed to the tilt angle of 5 to 10° in the vertical direction to the substrate.

As shown in FIG. 4C, a gate re-oxidation process is carried out, so that an oxide layer 45 is formed on the side wall of the gate and the surface of the substrate. At this time, the TiSi$_2$ layer 43 is not oxidized abnormally, since excessive Si exists in side wall portions of the TiSi$_2$ layer 43 by implantation of Si. Preferably, the oxide layer 35 is formed to the thickness of 20 to 50 Å.

According to the present invention as above described, a titanium silicide layer is deposited to a low mole ratio of Si/Ti, thereby preventing particle creation. Furthermore, a gate oxidation process is performed after implanting Si ions into the side wall or overall surface of the titanium silicide layer, thereby preventing abnormal oxidation of the titanium silicide during the gate re-oxidation process. As a result, the reliability of semiconductor device is improved.

Although the preferred embodiment of this invention has been disclosed for illustrative purpose, those skilled in the art will appreciate that various modifications, additions and substitutions are possible, without departing from the scope and spirit of the invention as described in the accompanying claims.

What is claimed is:

1. A method of forming a gate electrode with a titanium polycide structure, comprising the steps of:

forming a gate insulating layer and a polysilicon layer on a semiconductor substrate , in sequence;

forming a titanium silicide layer of an amorphous phase on the polysilicon layer by physical vapor deposition using a sputtering target of TiSix (x=2.0~2.2);

ion-implanting Si ions into the titanium silicide layer of the amorphous phase;

transforming the titanium silicide layer of the amorphous phase into a titanium silicide layer of a crystalline phase by performing a thermal process;

etching selectively the titanium silicide layer of the crystalline phase and the polysilicon layer in sequences to form a gate electrode; and performing a gate re-oxidation process.

2. The method according to claim 1, wherein the Si ions are implanted at a dose of $1 \times 10^{15}$ to $5 \times 10^{16}$ ions/cm$^2$.

3. The method according to claim 1, wherein the gate re-oxidation process is performed by dry oxidation at a temperature of about 700 to 850° C.

4. A method of forming a gate electrode with a titanium polycide structure, comprising the steps of:

forming a gate insulating layer and a polysilicon layer on a semiconductor substrate, in sequence;

forming a titanium silicide layer of an amorphous phase on the polysilicon layer by physical vapor deposition using a sputtering target of TiSix (x=2.0~2.2);

transforming the titanium silicide layer of the amorphous phase into a titanium silicide layer of a crystalline phase by performing a thermal process;

ion-implanting Si ions into the titanium silicide layer of the amorphous phase;

etching selectively the titanium silicide layer of the crystalline phase and the polysilicon layer in sequences to form a gate electrode; and performing a gate re-oxidation process.

5. The method according to claim 4, wherein the Si ions are implanted at a dose of $1 \times 10^{15}$ to $5 \times 10^{16}$ ions/cm$^2$.

6. The method according to claim 4, wherein the gate re-oxidation process is performed by dry oxidation at a temperature of about 700 to 850° C.

7. A method of forming a gate electrode with a titanium polycide structure, comprising the steps of:

forming a gate insulating layer and a polysilicon layer on semiconductor substrate, in sequence;

forming a titanium silicide layer on the polysilicon layer;

etching selectively the titanium silicide layer and the polysilicon layer in sequence to form a gate electrode;

implanting Si into the side wall of the gate electrode using a tilted ion-implantation; and performing a gate re-oxidation process.

8. The method according to claim 7, wherein the tilted ion-implantation is performed to the tilt angle of 5 to 10° in the vertical direction to the substrate.

9. The method according to claim 7, wherein the titanium silicide layer is deposited by physical vapor deposition using sputtering target of TiSix(x=2.0~2.2).

10. The method according to claim 7, wherein the Si ions are implanted at a dose of $1 \times 10^{15}$ to $5 \times 10^{16}$ ions/cm$^2$.

11. The method according to claim 7, wherein the gate re-oxidation process is performed by dry oxidation at a temperature of about 700 to 850° C.

12. A method of forming a gate electrode with a titanium polycide structure, comprising the steps of:

selectively etching a titanium silicide and polysilicon layer formed on a semiconductor substrate to form a gate electrode; and implanting Si ions into the side wall of the gate electrode using a tilted ion-implantation.

13. The method according to claim 12, further comprising the steps of:

performing a gate re-oxidation process by dry oxidation at a temperature of about 700 to 850° C.

14. The method according to claim 12, wherein the tilted ion-implantation is performed at a tilt angle of 5 to 10° in the vertical direction to the substrate.

15. The method according to claim 12, wherein the titanium silicide layer is deposited on the polysilicon layer by a physical vapor deposition process using a sputtering target of TiSix (x=2.0~2.2).

* * * * *